United States Patent
Kim et al.

(10) Patent No.: US 11,689,181 B2
(45) Date of Patent: Jun. 27, 2023

(54) PACKAGE COMPRISING STACKED FILTERS WITH A SHARED SUBSTRATE CAP

(71) Applicant: QUALCOMM Incorporated, San Diego, CA (US)

(72) Inventors: Jonghae Kim, San Diego, CA (US); Je-Hsiung Lan, San Diego, CA (US); Ranadeep Dutta, Del Mar, CA (US); Milind Shah, San Diego, CA (US); Periannan Chidambaram, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 198 days.

(21) Appl. No.: 16/884,891

(22) Filed: May 27, 2020

(65) Prior Publication Data

US 2021/0376810 A1     Dec. 2, 2021

(51) Int. Cl.
*H03H 9/05* (2006.01)
*H01L 25/04* (2023.01)
*H03H 9/02* (2006.01)
*H03H 9/145* (2006.01)
*H03H 9/64* (2006.01)
*H10N 30/02* (2023.01)
*H10N 30/87* (2023.01)
*H10N 30/88* (2023.01)
*H03H 3/02* (2006.01)

(52) U.S. Cl.
CPC ............ *H03H 9/058* (2013.01); *H01L 25/04* (2013.01); *H03H 3/02* (2013.01); *H03H 9/02992* (2013.01); *H03H 9/14544* (2013.01); *H03H 9/64* (2013.01); *H10N 30/02* (2023.02); *H10N 30/875* (2023.02); *H10N 30/883* (2023.02)

(58) Field of Classification Search
CPC .......... H03H 9/058; H03H 3/02; H01L 25/04; H01L 41/0475
See application file for complete search history.

(56) References Cited

U.S. PATENT DOCUMENTS 6,274,969 B1 *   8/2001   Gamo ...................... H03H 9/58
                                                                                 310/366
2008/0217708 A1   9/2008   Reisner et al.
(Continued)

OTHER PUBLICATIONS

International Search Report and Written Opinion—PCT/US2021/028145—ISAEPO—dated Aug. 9, 2021.

*Primary Examiner* — Samuel S Outten
(74) *Attorney, Agent, or Firm* — Loza & Loza, LLP

(57) ABSTRACT

A package that includes a first filter comprising a first polymer, a substrate cap, a second filter comprising a second polymer frame, at least one interconnect, an encapsulation layer and a plurality of through encapsulation vias. The substrate cap is coupled to the first polymer frame such that a first void is formed between the substrate cap and the first filter. The second polymer frame is coupled to the substrate cap such that a second void is formed between the substrate cap and the second filter. The at least one interconnect is coupled to the first filter and the second filter. The encapsulation layer encapsulates the first filter, the substrate cap, the second filter, and the at least one interconnect. The plurality of through encapsulation vias coupled to the first filter.

17 Claims, 14 Drawing Sheets

*SIDE PROFILE VIEW*

(56) References Cited

U.S. PATENT DOCUMENTS

2016/0301386 A1   10/2016  Iwamoto
2017/0179920 A1*  6/2017  Kawasaki ............ H03H 9/1092
2017/0331455 A1   11/2017  Kuroyanagi

* cited by examiner

ASSEMBLY VIEW

FIG. 2 PLAN VIEW — SAW FILTER DESIGN

SIDE PROFILE VIEW

PACKAGE COMPRISING STACKED FILTERS WITH A SHARED SUBSTRATE CAP

FIELD

Various features relate to a filter implemented in an integrated device, but more specifically to a package that includes stacked filters with a shared substrate cap.

BACKGROUND

Radio frequency (RF) filters are components of a wireless device for filtering out unwanted signals. For example, a RF filter may be used to filter out signals at various frequencies, while letting through signals at a certain frequency. A wireless device may be configured to operate at different frequencies by including many RF filters, where each RF filter is configured to allow a certain signal with a certain frequency to pass through, thereby allowing the wireless device to operate and/or communicate at that frequency. However, RF filters take up a lot of a space. A small wireless device has space constraints and may not be able to accommodate many RF filters, which limits the number of frequencies the small wireless device may operate and/or communicate at. There is an ongoing need to provide RF filters with better form factors and smaller sizes so that the RF filters may be implemented in smaller devices.

SUMMARY

Various features relate to a filter implemented in an integrated device, but more specifically to a package that includes stacked filters with a shared substrate cap.

One example provides a package that includes a first filter comprising a first polymer, a substrate cap, a second filter comprising a second polymer frame, at least one interconnect, an encapsulation layer and a plurality of through encapsulation vias. The substrate cap is coupled to the first polymer frame such that a first void is formed between the substrate cap and the first filter. The second polymer frame is coupled to the substrate cap such that a second void is formed between the substrate cap and the second filter. The at least one interconnect is coupled to the first filter and the second filter. The encapsulation layer encapsulates the first filter, the substrate cap, the second filter, and the at least one interconnect. The plurality of through encapsulation vias coupled to the first filter.

Another example provides an apparatus that includes means for first filtering comprising a first polymer, a substrate cap, means for second filtering comprising a second polymer frame, at least one interconnect, means for encapsulation and a plurality of through encapsulation vias. The substrate cap is coupled to the first polymer frame such that a first void is formed between the substrate cap and the means for first filtering. The second polymer frame is coupled to the substrate cap such that a second void is formed between the substrate cap and the means for second filtering. The at least one interconnect is coupled to the means for first filtering and the means for second filtering. The means for encapsulation encapsulates the means for first filtering, the substrate cap, the means for second filtering, and the at least one interconnect. The plurality of through encapsulation vias coupled to the means for first filtering.

Another example provides a method for fabricating a package. The method provides a first filter comprising a first polymer frame. The method couples a substrate cap to the first polymer frame such that a first void is formed between the substrate cap and the first filter. The method forms at least one interconnect over the first filter and the substrate cap. The method couples a second filter to the substrate cap through a second polymer frame such that (i) a second void is formed between the substrate cap and the second filter, and (ii) the at least one interconnect over the first filter is coupled to the second filter. The method forms an encapsulation layer that encapsulates the first filter, the substrate cap and the second filter, and the at least one interconnect. The method forms a plurality of through encapsulation vias in the encapsulation layer, where at least one through encapsulation via is coupled to the first filter.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first filter comprising a first polymer, a substrate cap, a second filter comprising a second polymer frame, at least one interconnect, an encapsulation layer and a plurality of through encapsulation vias. The substrate cap is coupled to the first polymer frame such that a first void is formed between the substrate cap and the first filter. The second polymer frame is coupled to the substrate cap such that a second void is formed between the substrate cap and the second filter. The at least one interconnect is coupled to the first filter and the second filter. The encapsulation layer encapsulates the first filter, the substrate cap, the second filter, and the at least one interconnect. The plurality of through encapsulation vias coupled to the first filter. The filters may be signal filters (e.g., radio frequency (RF) filters). The first filter and the second filter may each be an integrated device that includes a substrate comprising a piezoelectric material. The configuration of the package provides a package with a more compact form factor and a smaller footprint, while providing multiple filters. For example, stacking the second filter over the first filter, or vice versa, reduces the laterally size of the package. Moreover, the sharing of the substrate cap by the first filter and second filter reduces the number of components for the package, while still providing effective signal filtering by each respective filter.

Exemplary Integrated Device Configured as a Filter

Figure 1:
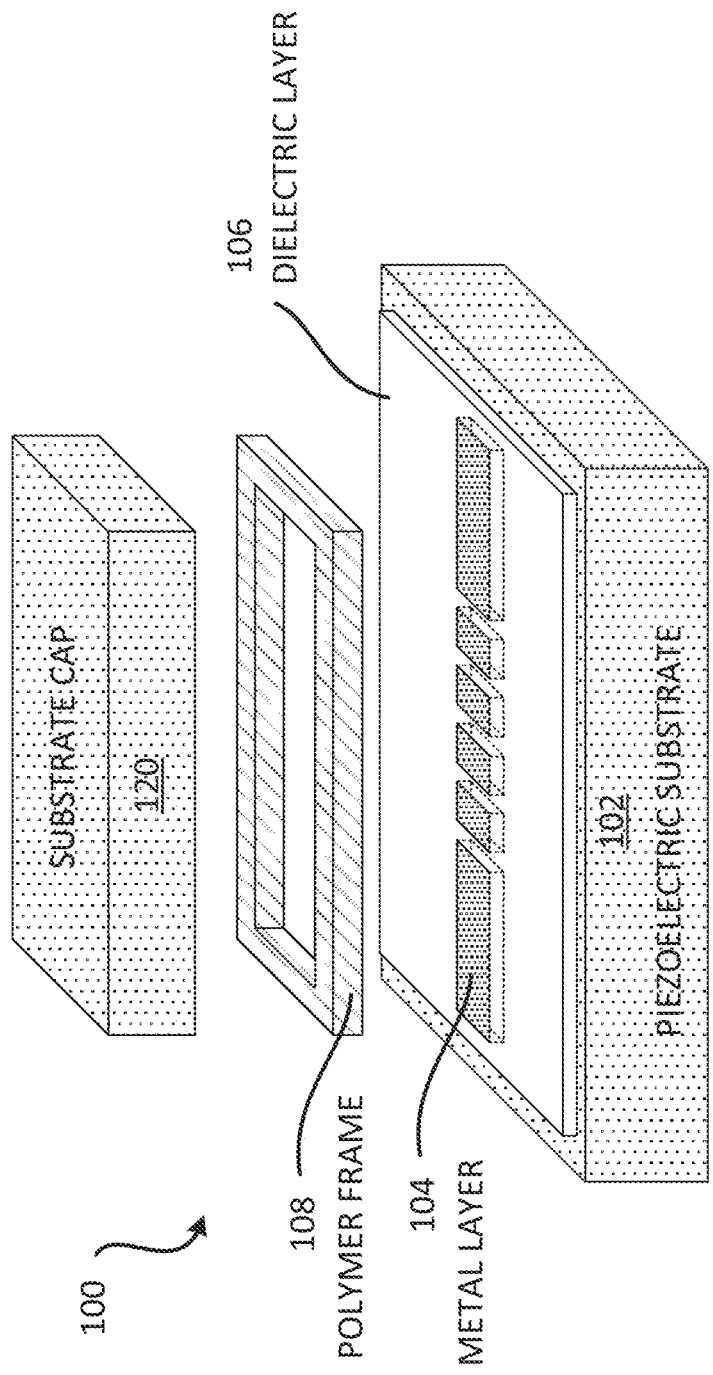
FIG. 1 illustrates an assembly view of an integrated device configured to operate as a signal filter.

FIG. 1 illustrates a plan view of on an integrated device 100 (e.g., bare die) that is configured to operate as a filter. A filter may be a signal filter. A filter may include a radio frequency (RF) filter. The integrated device 100 may be implemented in a radio frequency front end (RFFE) package. The integrated device 100 may be implemented as a device.

The integrated device 100 includes a substrate 102, a metal layer 104, a dielectric layer 106, a polymer frame 108 and a substrate cap 120. The substrate 102 may be a piezoelectric substrate. For example, the substrate 102 may include a piezoelectric material (e.g., Aluminum Nitride (AlN), quartz, Lithium Niobate, Lithium Tantalate). In another example, the substrate 102 may include a piezoelectric layer that is formed and located over a surface of the substrate 102. For example, the substrate 102 may include glass with a piezoelectric layer formed and located over a surface of the glass. Other materials may be used instead of glass. A piezoelectric substrate as used in the disclosure may mean a substrate that includes a piezoelectric material and/or a substrate that includes a piezoelectric layer located over a surface of the substrate. Different implementations may use different materials for the piezoelectric material and/or the piezoelectric layer.

The metal layer 104 is formed over the substrate 102. In instances when the substrate 102 includes a piezoelectric layer formed and located over a surface of the substrate 102, the metal layer 104 may be formed and located over the piezoelectric layer. The metal layer 104 may include an electrically conductive material, such as copper (Cu). The metal layer 104 may be configured as interconnects, electrodes and/or transducers for the integrated device 100. The metal layer 104 may be at least one metal layer. Thus, in some implementations, the metal layer 104 may conceptually represent two or more metal layers.

The dielectric layer 106 is formed over the substrate 102. In instances when the substrate 102 includes a piezoelectric layer formed and located over a surface of the substrate 102, the dielectric layer 106 may be formed and located over the piezoelectric layer. The dielectric layer 106 may be co-planar with the metal layer 104.

The polymer frame 108 is formed and located over a surface of the substrate 102. The polymer frame 108 may be formed over, located over and/or coupled to the metal layer 104 and/or the dielectric layer 106. The substrate cap 120 is coupled to the polymer frame 108. The polymer frame 108 may be configured as a mechanical and structural support component for the substrate cap 120, allowing the substrate cap 120 to be placed and located over the substrate 102, the metal layer 104 and the dielectric layer 106, while creating a void between the substrate 102 and the substrate cap 120. A void may be a at least one region that is free of a solid material. A void may include a cavity. A void may be occupied by a gas (e.g., air). The substrate cap 120 may include different material. The substrate cap 120 may include the same material as the substrate 102.

The integrated device 100 (e.g., integrated circuit die) may be configured to operate as a surface acoustic wave (SAW) filter or a bulk acoustic wave (BAW) filter. The integrated device 100 may be configured to filter out signals at one or more frequencies or extract signals at one or more frequencies. The integrated device 100 may be means for signal filtering and/or means for signal extraction. Signal filtering may include signal extraction.

Figure 2:
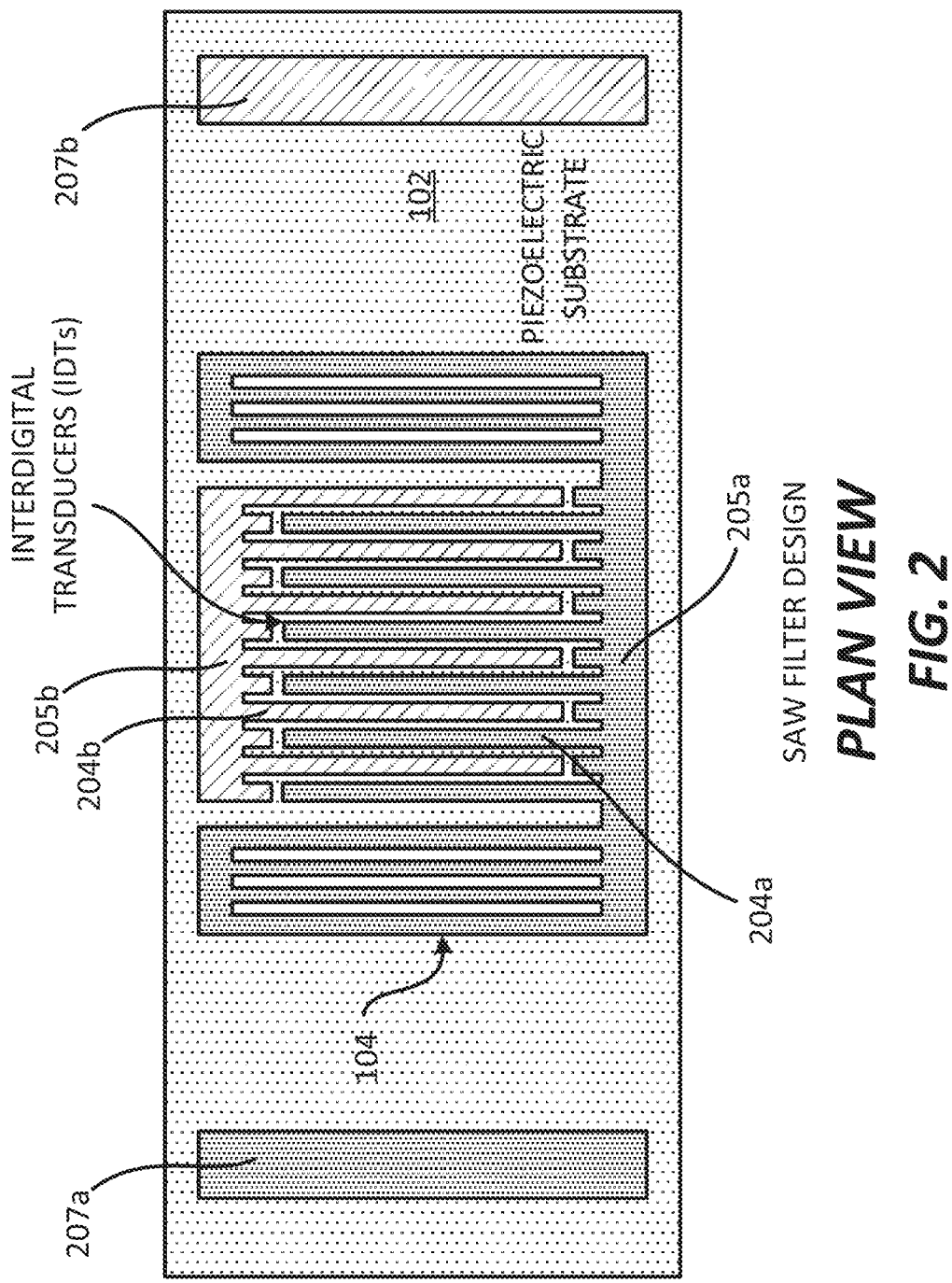
FIG. 2 illustrates a plan view of a metal layer of an integrated device configured to operate as a signal filter.

FIG. 2 illustrates a top plan view of the substrate 102 and the metal layer 104 of the integrated device 100. The dielectric layer 106 is not shown in FIG. 2. As shown in FIG. 2, the metal layer 104 is patterned in such a way that portions of the metal layer 104 may be configured as transducers, electrodes and/or interconnects. For example, portions of the metal layer 104 may be patterned and configured to operate as interdigital transducers 204a-204b. Other portions of the metal layer 104 may be patterned and configured to operate as electrodes 205a-205b. Other portions of the metal layer 104 may be patterned and configured to operate as interconnects 207a-207b. It is noted that different implementations may have a metal layer 104 with different patterns and/or configurations. The metal layer 104 may be formed on a first surface of the substrate 102 or a second surface of the substrate 102. For example, the metal layer 104 may be formed on a top surface of the substrate 102 or a bottom surface of the substrate 102. In some implementations, metal layers may be formed over a first surface and a bottom surface of the substrate 102. As mentioned above, the metal layer 104 may represent at least one metal layer. In some implementations, the metal layer 104 may conceptually represent two or more metal layers. Different components may be defined by different metal layers. For example, the metal layer 104 may include a first metal layer and second metal layer. The first metal layer may be used to form the interdigital transducers 204a-204b, and a second metal layer may be used to form the electrodes 205a-205b and/or the interconnects 207a-207b. The second metal layer may be coupled to the first metal layer.

Figure 3:
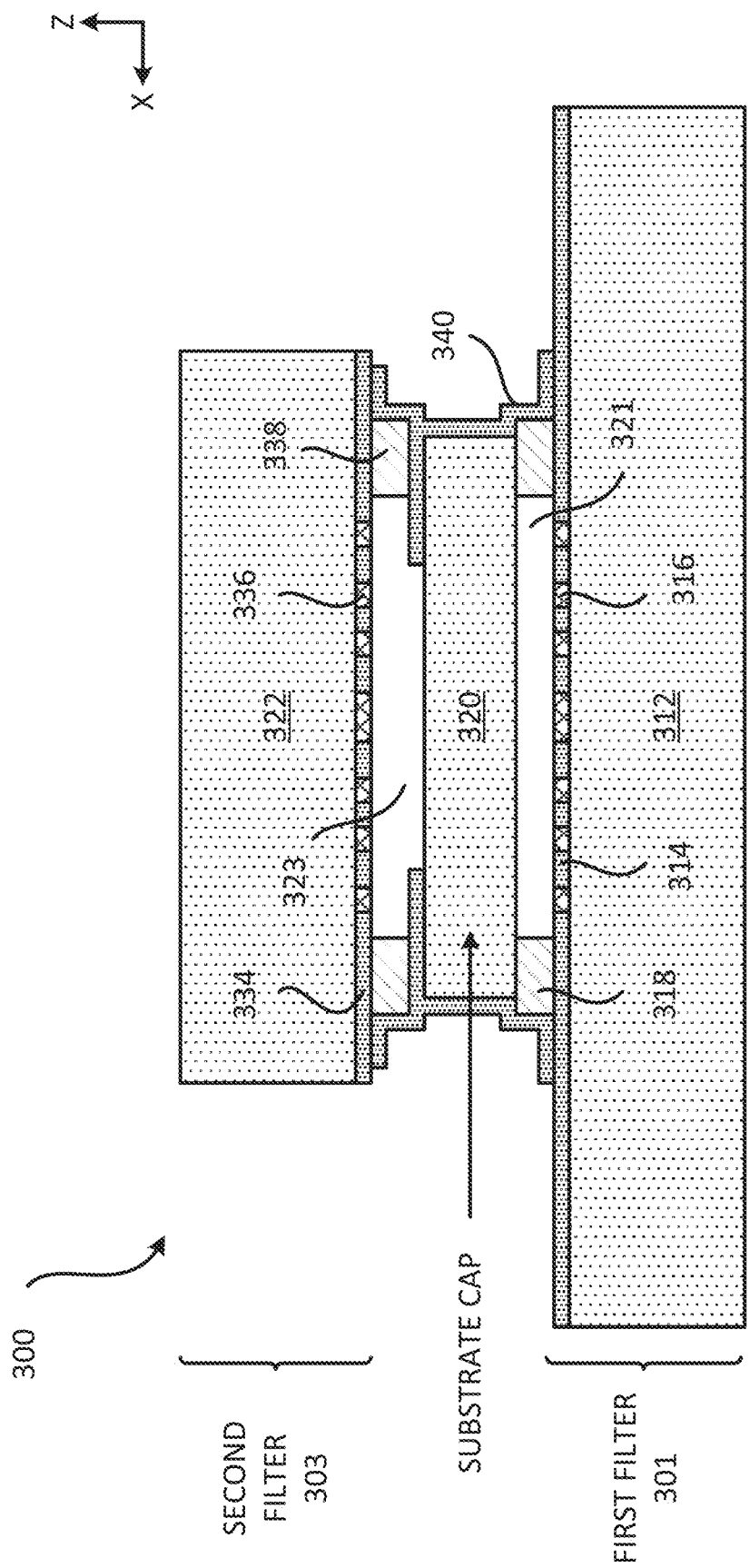
FIG. 3 illustrates a profile view of a device that includes multiple integrated devices configured to operate as signal filters.

FIG. 3 illustrates a device 300 that includes stacked filters for signal filtering. The device 300 includes a first filter 301, a second filter 303 and a substrate cap 320. The substrate cap 320 is coupled to the first filter 301 and the second filter 303. The substrate cap 320 is located between the first filter 301 and the second filter 303. The first filter 301 and the second filter 303 may share the substrate cap 320. The front side of the first filter 301 faces the substrate cap 320 and the front side of the second filter 303. The front side of the second filter 303 faces the substrate cap 320 and the front side of the first filter 301. The first filter 301 may be means for first signal filtering. The second filter 303 may be means for second signal filtering. The device 300 may be implemented in a radio frequency front end (RFFE) package.

The substrate cap 320 is coupled to the first filter 301 such that a first void 321 is formed between the substrate cap 320 and the first filter 301. The substrate cap 320 is coupled to the second filter 303 such that a second void 323 is formed between the substrate cap 320 and the second filter 303. A void may be a at least one region that is free of a solid material. A void may include a cavity. A void may be occupied by a gas (e.g., air).

As shown in FIG. 3, the first filter 301 and the second filter 303 share the substrate cap 320. The substrate cap 320 may be considered part of the first filter 301 and/or the second filter 303. The stacking (e.g., vertical stacking) of the first filter 301 and the second filter 303 allows for a device with a more compact form factor and a reduced footprint. The first filter 301 and/or the second filter 303 may be configured to operate as a surface acoustic wave (SAW) filter or a bulk acoustic wave (BAW) filter. The first filter 301 and/or the second filter 303 may each be implemented as an integrated device (e.g., bare die). The first filter 301 may be configured to extract a first signal with a first frequency (while filtering out one or more other frequencies), while the second filter 303 may be configured to extract a second signal with a second frequency (while filtering out one or more other frequencies). When the first filter 301 and the second filter 303 are implemented with a wireless device (e.g., device with wireless capabilities), the wireless device may be able to operate and/or communicate at the first frequency and/or the second frequency.

The first filter 301 includes the first substrate 312, a first metal layer 314, and a first dielectric layer 316. The first filter 301 may be similar to the integrated device 100 configured to operate as a filter (e.g., signal filter) and/or extractor (e.g., signal extractor). The first substrate 312 may be a first piezoelectric substrate. For example, the first substrate 312 may include a piezoelectric material (e.g., Aluminum Nitride (AlN), quartz). In another example, the first substrate 312 may include a piezoelectric layer that is formed and located over a surface of the first substrate 312. For example, the first substrate 312 may include glass with a piezoelectric layer formed and located over a surface of the glass. Other materials may be used instead of glass.

The first metal layer 314 is formed over and coupled to the first substrate 312. In instances when the first substrate 312 includes a piezoelectric layer formed and located over a surface of the first substrate 312, the first metal layer 314 may be formed and located over the piezoelectric layer. The first metal layer 314 may include an electrically conductive material, such as copper (Cu). The first metal layer 314 may be configured as interconnects, electrodes and/or transducers for the first filter 301. The first metal layer 314 may represent at least one metal layer. In some implementations, the first metal layer 314 may conceptually represent two or more metal layers. Different components may be defined by different metal layers, as described in at least FIG. 2.

The first dielectric layer 316 is formed over and coupled to the first substrate 312. In instances when the first substrate 312 includes a piezoelectric layer formed and located over a surface of the first substrate 312, the first dielectric layer 316 may be formed and located over the piezoelectric layer. The first dielectric layer 316 may be co-planar with the first metal layer 314.

The first polymer frame 318 is formed and located over a surface of the first substrate 312. The first polymer frame 318 may be formed over, located over and coupled to the first metal layer 314 and/or the first dielectric layer 316. The substrate cap 320 is coupled to the first polymer frame 318. The first polymer frame 318 may be configured as a mechanical and structural support component for the substrate cap 320. The substrate cap 320, the first polymer frame 318 and the first filter 301 may be coupled together such that the void 321 is formed.

The second filter 303 includes the second substrate 322, a second metal layer 334, and a second dielectric layer 336. The second filter 303 may be similar to the integrated device 100 configured to operate as a filter (e.g., signal filter) and/or extractor (e.g., signal extractor). The second substrate 322 may be a second piezoelectric substrate. For example, the second substrate 322 may include a piezoelectric material (e.g., Aluminum Nitride (AlN), quartz). In another example, the second substrate 322 may include a piezoelectric layer that is formed and located over a surface of the second substrate 322. For example, the second substrate 322 may include glass with a piezoelectric layer formed and located over a surface of the glass. Other materials may be used instead of glass.

The second metal layer 334 is formed over and coupled to the second substrate 322. In instances when the second substrate 322 includes a piezoelectric layer formed and located over a surface of the second substrate 322, the second metal layer 334 may be formed and located over the piezoelectric layer. The second metal layer 334 may include an electrically conductive material, such as copper (Cu). The second metal layer 334 may be configured as interconnects, electrodes and/or transducers for the second filter 303. The second metal layer 334 may represent at least one metal layer. In some implementations, the second metal layer 334 may conceptually represent two or more metal layers. Different components may be defined by different metal layers, as described in at least FIG. 2.

The second dielectric layer 336 is formed over and coupled to the second substrate 322. In instances when the second substrate 322 includes a piezoelectric layer formed and located over a surface of the second substrate 322, the second dielectric layer 336 may be formed and located over the piezoelectric layer. The second dielectric layer 336 may be co-planar with the second metal layer 334.

The second polymer frame 338 is formed and located over a surface of the second substrate 322. The second polymer frame 338 may be formed, located and coupled to the second metal layer 334 and/or the second dielectric layer 336. The substrate cap 320 is coupled to the second polymer frame 338. The second polymer frame 338 may be configured as a mechanical and structural support component for the substrate cap 320. The substrate cap 320, the second polymer frame 338 and the second filter 303 may be coupled together such that the void 323 is formed.

At least one interconnect 340 is formed and located over at least one surface of the first filter 301, at least one surface of the substrate cap 320 and at least one surface of the second filter 303. For example, the at least one interconnect 340 may be formed and located over (i) a side surface of the second polymer frame 338, (ii) a surface of the substrate cap 320, and (iii) a side surface of the first polymer frame 318. The at least one interconnect 340 may be coupled to portions of the second metal layer 334 and portions of the first metal layer 314. The at least one interconnect 340 may be located between a surface of the substrate cap 320 and the second polymer frame 338.

FIG. 3 illustrates that an interconnect 340 located between the substrate cap 320 and the second polymer frame 338. In some implementation, there may not be an interconnect between the substrate cap 320 and the second polymer frame 338. Thus, in some implementations, the second polymer frame 338 may be coupled to a surface of the substrate cap 320.

Figure 4:
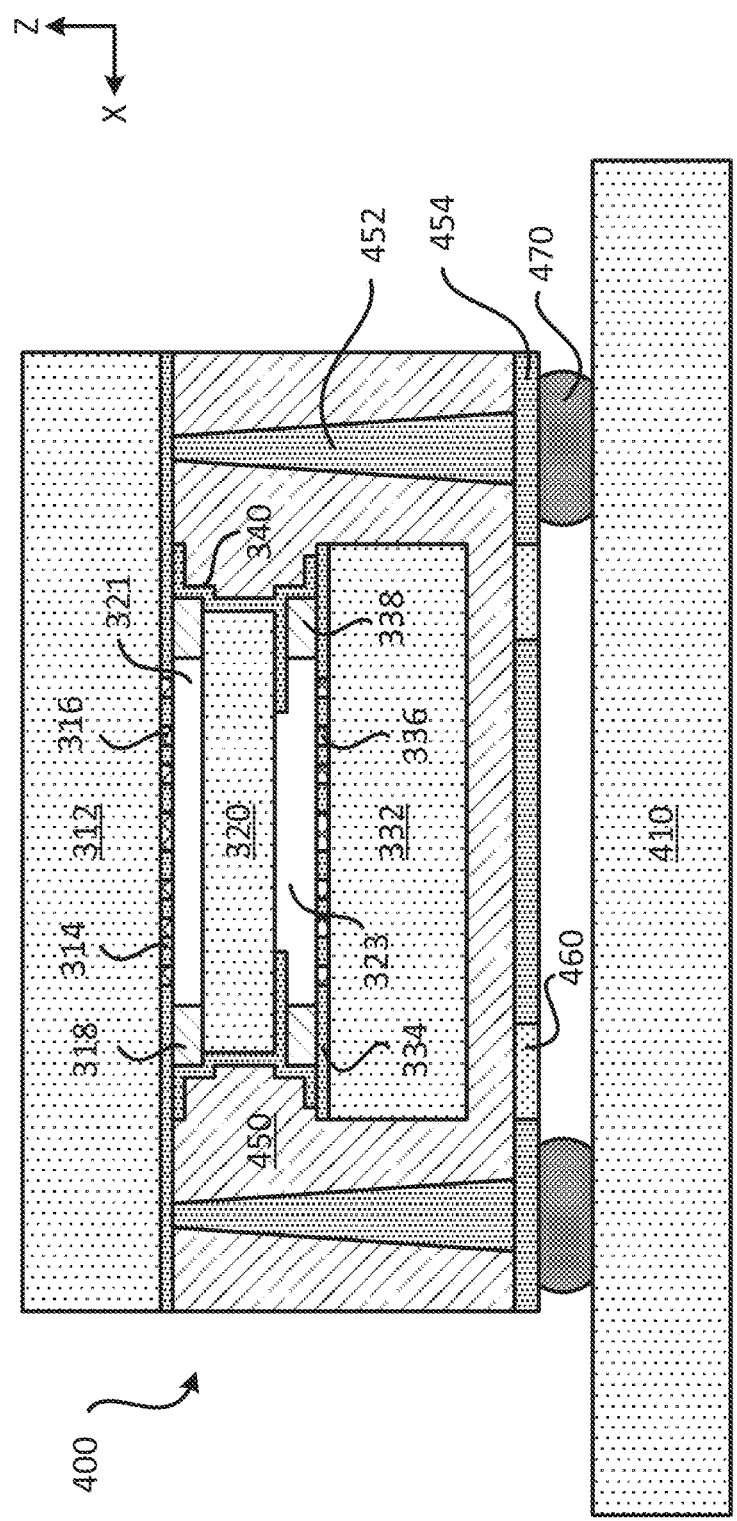
FIG. 4 illustrates a profile view of a package that includes multiple integrated devices configured to operate as signal filters.

FIG. 4 illustrates a package 400 that includes stacked filters encapsulated by an encapsulation layer. The package 400 includes the device 300, as described in FIG. 3. The package 400 includes the first filter 301, the second filter 303, the substrate cap 320, the first polymer frame 318, the second polymer frame 338, the at least one interconnect 340, an encapsulation layer 450, a plurality of through encapsulation vias 452, a plurality of interconnects 454, and a passivation layer 460. The package 400 is coupled to a board 410 (e.g., printed circuit board) through a plurality of solder interconnects 470. The plurality of solder interconnects 470 may be considered part of the package 400. The package 400 may be implemented as part of a radio frequency front end (RFFE) package.

As shown in FIG. 4, the encapsulation layer 450 encapsulates the device 300. For example, the encapsulation layer 450 encapsulates the first filter 301, the second filter 303, the substrate cap 320, the first polymer frame 318, the second polymer frame 338, and the at least one interconnect 340. The encapsulation layer 450 may include a mold, a resin and/or an epoxy. The encapsulation layer 450 may be means for encapsulation. The encapsulation layer 450 may be provided by using a compression and transfer molding process, a sheet molding process, or a liquid molding process.

The void 321 and the void 323 are located in the package 400. The plurality of through encapsulation vias 452 travels through the encapsulation layer 450. At least one through encapsulation via 452 is coupled to the first filter 301. At least one through encapsulation via 452 may be coupled to at least one portion of the first metal layer 314. At least one through encapsulation via 452 is indirectly coupled to the second filter 303. For example, the at least through encapsulation via 452 may be configured to be electrically coupled to the second filter 303, through the first metal layer 314, the at least one interconnect 340 and the second metal layer 334. In some implementations, the at least one through encapsulation via 452 may be configured to be electrically coupled to the second filter 303, through the at least one interconnect 340 and the second metal layer 334, bypassing the first metal layer 314. Thus, at least one first through encapsulation via from the plurality of through encapsulation via 452 is configured to be electrically coupled to the first filter 301 (e.g., coupled to electrodes of the first filter 301), and at least one second through encapsulation via from the plurality of through encapsulation via 452 is configured to be electrically coupled to the second filter 303 (e.g., coupled to electrodes of the second filter 303).

The plurality of interconnects 454 (e.g., surface interconnects) may be coupled to the plurality of through encapsulation vias 452. The plurality of interconnects 454 be formed and located over a surface of the encapsulation layer 450. The plurality of solder interconnects 470 may be coupled to the plurality of interconnects 454. The passivation layer 460 may be formed and located over a surface of the encapsulation layer 450. The passivation layer 460 may be co-planar with the plurality of interconnects 454.

The package 400 provides a package with a more compact form factor and a reduced footprint, thereby allowing the package 400 to be implemented in smaller devices. In some implementations, several packages 400 may be coupled to the board 410 of a wireless device (e.g., device with wireless capabilities), with each package configured to filter and/or extract signals with different frequencies. This would allow the wireless device (e.g., device with wireless capabilities) to operate and/or communicate at several frequencies, while keeping the size of the wireless device as small as possible.

Figure 5:
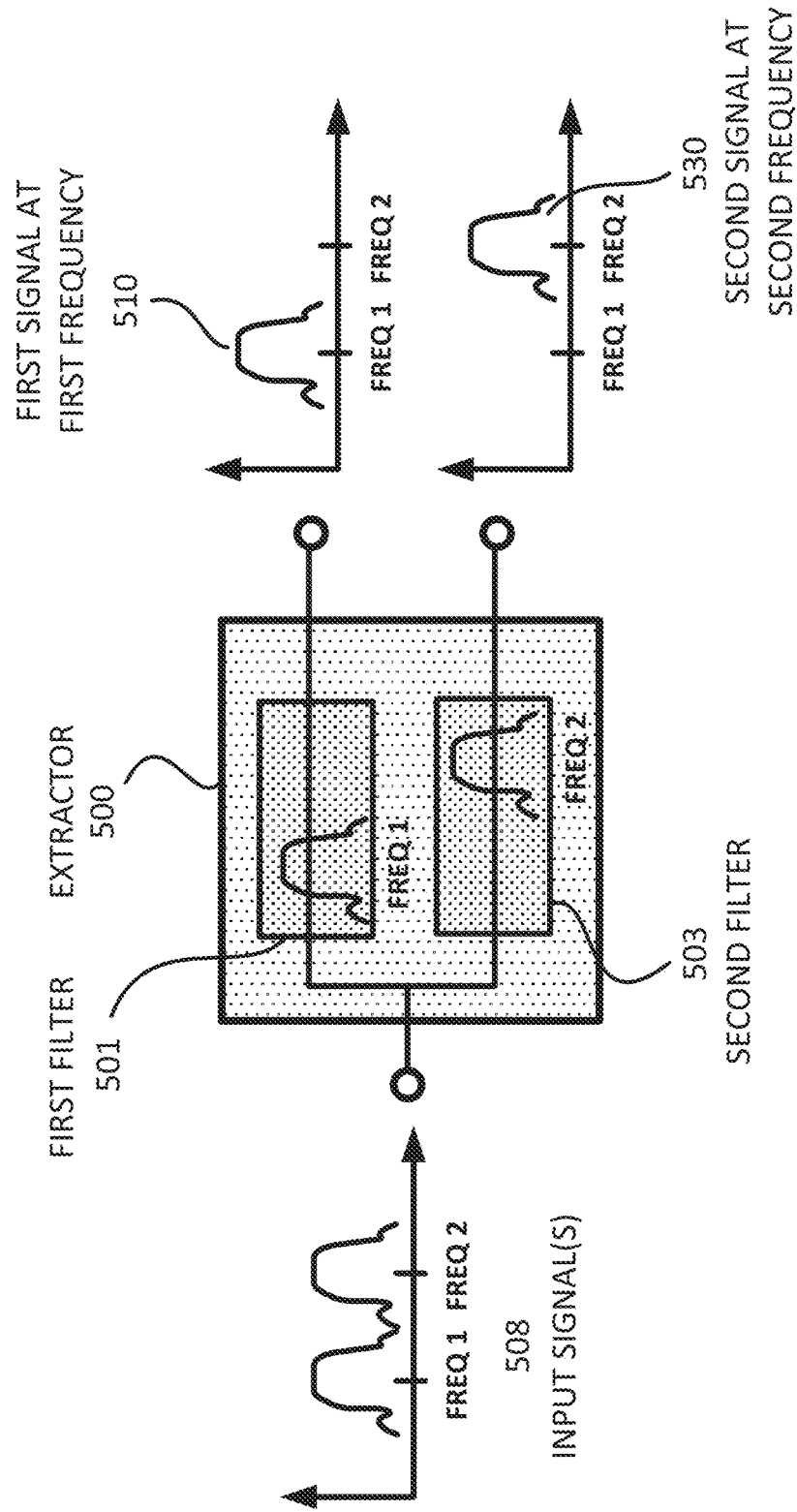
FIG. 5 conceptually illustrates multiple filters used to filter and extract signals at different frequencies.

FIG. 5 conceptually illustrates how several filters (e.g., signal filters) may be used to filter out unwanted signals and extract certain signals from at least one input signal. FIG. 5 conceptually illustrates an extractor 500 that includes a first filter 502 and a second filter 503. The extractor 500 may be implemented as the package 400. The first filter 501 may be the first filter 301. The second filter 503 may be the second filter 303. The extractor 500 may receive at least one input signal 508 that includes a first signal at a first frequency and a second signal at a second frequency. The first filter 501 may receive the at least one input signal 508 and filter unwanted signals at certain frequencies, while leaving or passing through the first signal 510 at the first frequency. The second filter 503 may receive the at least one input signal 508 and filter unwanted signals at certain frequencies, while leaving or passing through the second signal 530 at the second frequency. Thus, the extractor 500 effectively extracts the first signal 510 and the second signal 530 from the input signal 508. In some implementations, multiple extractors may be used to filter and extract several signals at different frequencies.

Exemplary Sequence for Fabricating a Filter

Figure 6A:
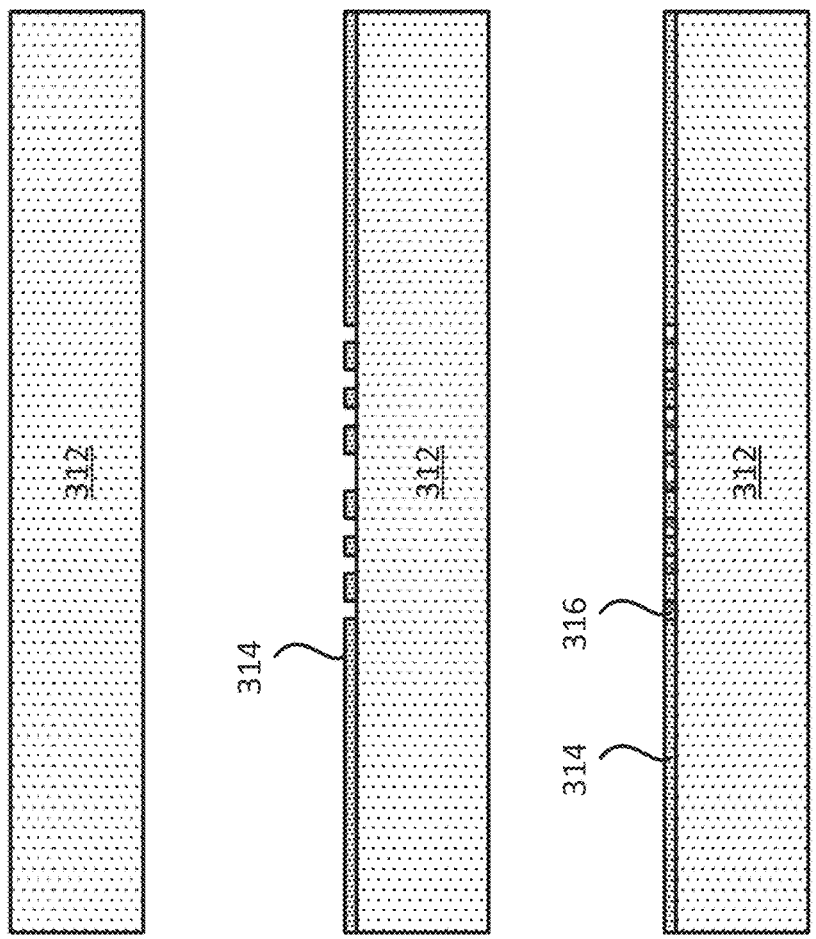
FIGS. 6A-6B illustrate an exemplary sequence for fabricating an integrated device configured to operate as a signal filter.
Figure 6B:
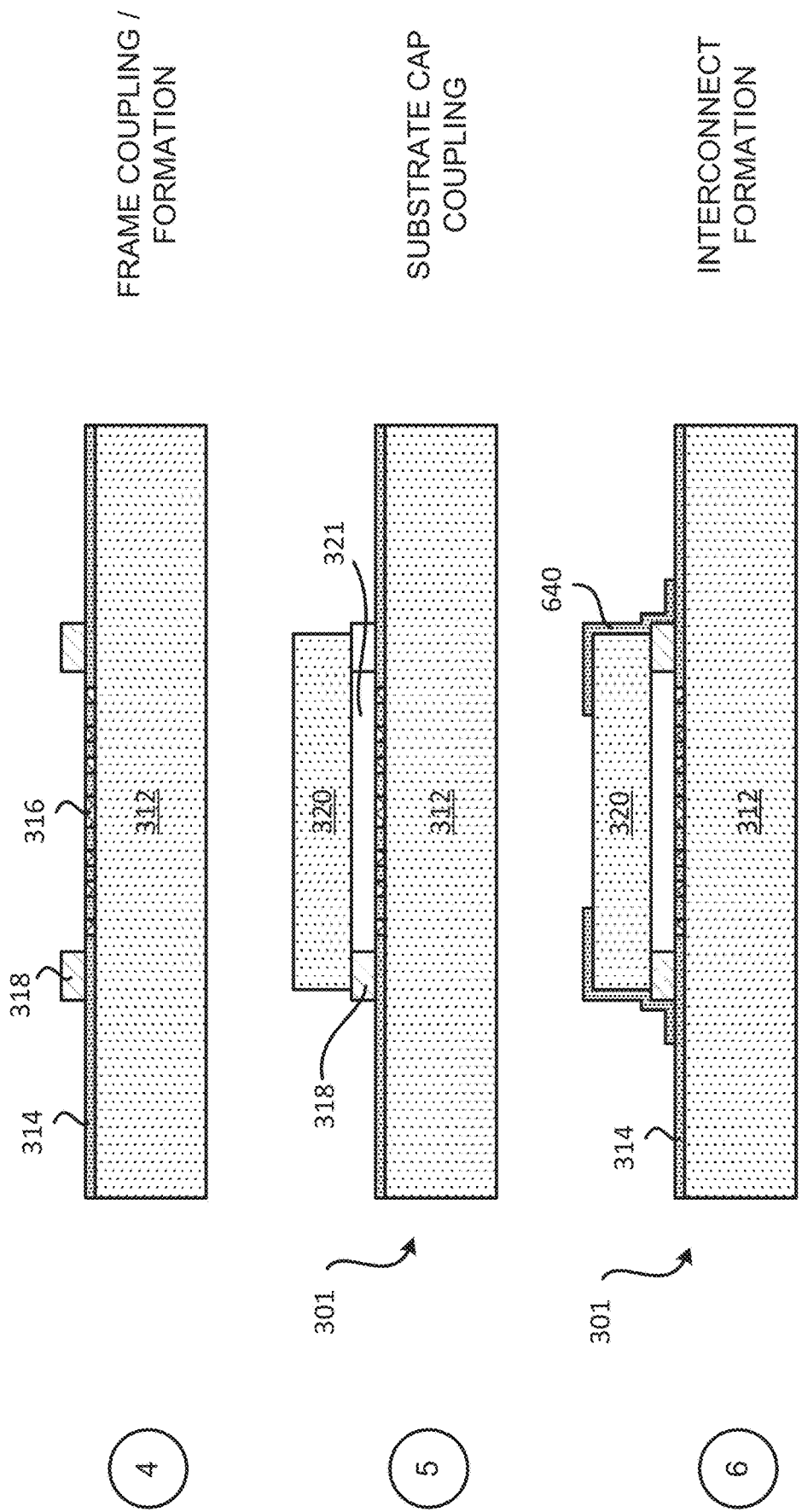

In some implementations, fabricating a filter includes several processes. FIGS. 6A-6B illustrate an exemplary sequence for providing or fabricating a filter. In some implementations, the sequence of FIGS. 6A-6B may be used to provide or fabricate the first filter 301 of FIG. 3. However, the process of FIGS. 6A-6B may be used to fabricate any of the filters described in the disclosure. For example, the process of FIGS. 6A-6B may be used to fabricate the second filter 303.

It should be noted that the sequence of FIGS. 6A-6B may combine one or more stages in order to simplify and/or clarify the sequence for providing or fabricating a filter. In some implementations, the order of the processes may be changed or modified. In some implementations, one or more of processes may be replaced or substituted without departing from the spirit of the disclosure.

Stage 1, as shown in FIG. 6A, illustrates a state after a first substrate 312 is provided. The first substrate 312 may be a piezoelectric substrate. The first substrate 312 may include a piezoelectric material. In some implementations, the first substrate 312 may include a piezoelectric layer that is formed and located over a first surface (e.g., top surface) of the first substrate 312. For example, the first substrate 312 may include glass with a piezoelectric layer formed and located over a first surface of the glass. Other materials may be used instead of glass. Different implementations may use different material may be used for the piezoelectric material (e.g., Aluminum Nitride (AlN). The entire substrate may be made of a piezoelectric material or only a portion of the substrate may include a piezoelectric material.

Stage 2 illustrates a state after a first metal layer 314 is formed over the first surface of the first substrate 312. The first metal layer 314 may be a patterned metal layer. A plating process may be used to form the first metal layer 314. The first metal layer 314 may be formed over a piezoelectric layer. The first metal layer 314 may be patterned to be configured as transducers, electrodes and/or interconnects. Different implementations may use different patterns and/or configurations for the first metal layer 314. The first metal layer 314 may represent at least one metal layer. The first metal layer 314 may include two or more metal layers. In some implementations, the first metal layer 314 may include a first particular metal layer and a second particular metal layer. In such instances, the first particular metal layer may be formed and then the second particular metal layer may be formed. The first particular metal layer and the second particular metal layer may include the same material or may include different materials.

Stage 3 illustrates a state after a first dielectric layer 316 is formed over the first surface of the first substrate 312. A deposition process may be used to form the first dielectric layer 316. The first dielectric layer 316 may be formed over a piezoelectric layer.

Stage 4, as shown in FIG. 6B, illustrates a state a first polymer frame 318 is formed over and coupled to the first metal layer 314 and the first dielectric layer 316. The first polymer frame 318 may be formed over the substrate 312. A deposition process may be used to form the first polymer frame 318. The first polymer frame 318 may have different shapes and sizes. The first polymer frame 318 may be configured to provide mechanical and structural support for another component.

Stage 5 illustrates a state after a substrate cap 320 is coupled to the first polymer frame 318, which forms a void 321 between the substrate cap 320 and the first substrate 312. The substrate cap 320 may include the same material as the first substrate 312. The substrate cap 320 may be bonded to the first polymer frame 318. The first polymer frame 318 is configured to provide structural support for the substrate cap 320. The first polymer frame 318 may laterally surround the void 321. Stage 5 may illustrate the first filter 301 that includes the first substrate 312, the first metal layer 314, the first dielectric layer 316, the first polymer frame 318, the substrate cap 320 and the void 321.

Stage 6 illustrates a state after at least one interconnect 640 is formed over surfaces of (i) the first substrate 312, (ii) the first metal layer 314, (iii) the first dielectric layer 316, (iv) the first polymer frame 318 and/or (v) the substrate cap 320. A plating process may be used to form the at least one interconnect 640. As will be further described below, the at least one interconnect 640 may be part of the at least one interconnect 340, as described in FIGS. 3 and 4. Stage 6 may illustrate the first filter 301 that includes the first substrate 312, the first metal layer 314, the first dielectric layer 316, the first polymer frame 318, the substrate cap 320, the void 321 and the at least one interconnect 640.

The first filter 301 may be implemented as an integrated device (e.g., bare die). The above process may be used to fabricate the second filter 303. Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating a Device Comprising Stacked Filters

Figure 7:
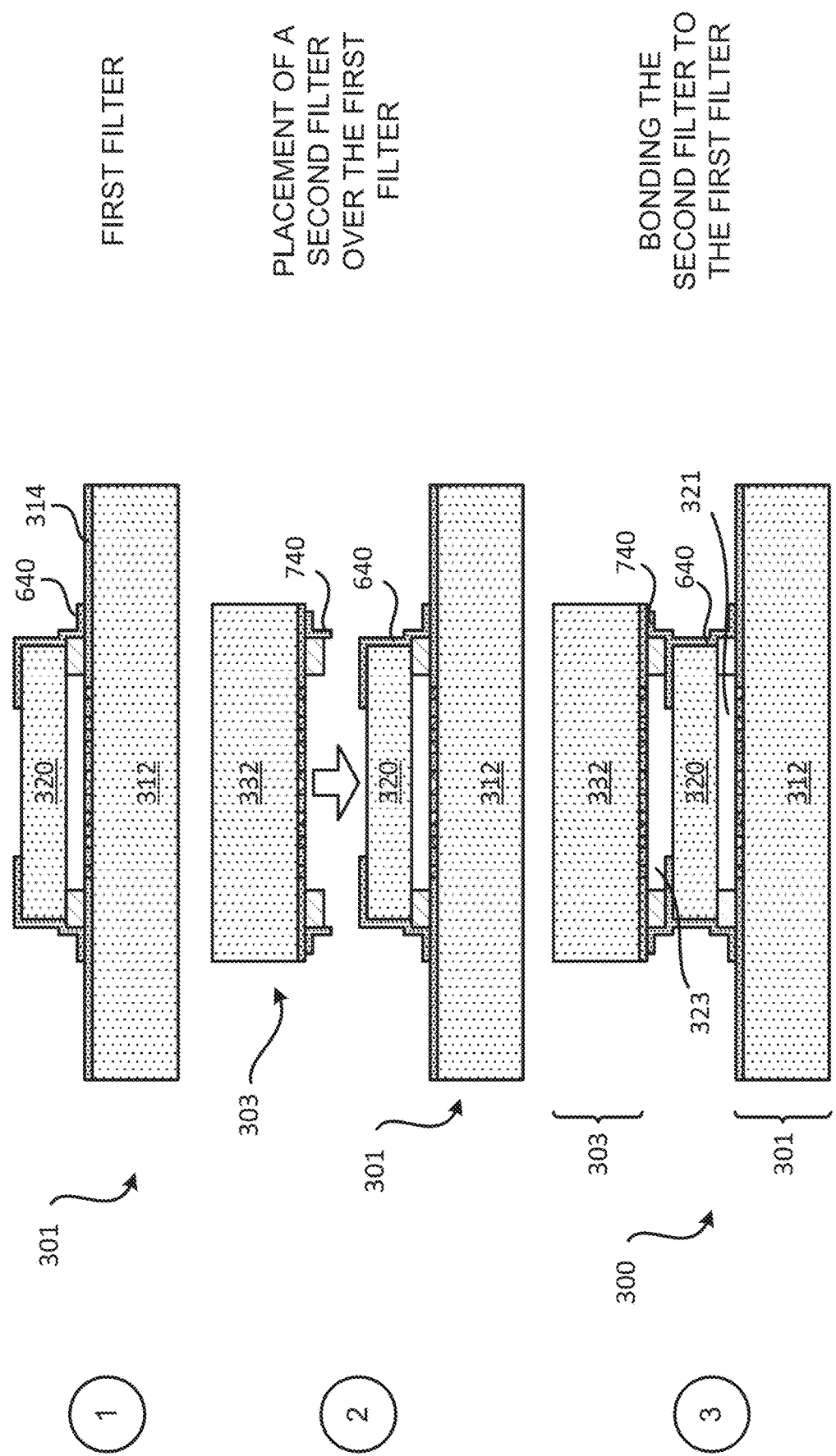
FIG. 7 illustrates an exemplary sequence for fabricating a package that includes multiple integrated devices configured to operate as signal filters.

In some implementations, fabricating a device that includes stacked filters for signal filtering includes several processes. FIG. 7 illustrates an exemplary sequence for providing or fabricating a device that includes stacked filters. In some implementations, the sequence of FIG. 7 may be used to provide or fabricate the device 300 of FIG. 3. However, the process of FIG. 7 may be used to fabricate any of the devices that includes stacked filters described in the disclosure.

It should be noted that the sequence of FIG. 7 may combine one or more stages in order to simplify and/or clarify the sequence for providing or fabricating a device that includes stacked filters. In some implementations, the order of the processes may be changed or modified. In some implementations, one or more of processes may be replaced or substituted without departing from the spirit of the disclosure.

Stage 1, as shown in FIG. 7, illustrates a state after a first filter 301 is provided. The first filter 301 may include the first substrate 312, the first metal layer 314, the first dielectric layer 316, the first polymer frame 318, the substrate cap 320, the void 321 and the at least one interconnect 640. The first filter 301 may be tested by connecting probes to portions of the at least one interconnect 640. For example, probes for testing the filter may be connected to portions of the at least one interconnect 640 that is located over the substrate cap 320. FIGS. 6A-6B illustrate an exemplary sequence for fabricating and providing the first filter 301.

Stage 2 illustrates a state as a second filter 303 is placed over the first filter 301. The second filter 303 may include the second substrate 332, the second metal layer 334, the second dielectric layer 336, the second polymer frame 338 and the at least one interconnect 740. The second filter 303 may be fabricated using a similar process as described in FIGS. 6A-6B. A pick and place process may be used to place the second filter 303 over the first filter 301. The second filter 303 may be placed over the substrate cap 320, such that a void 323 is formed.

Stage 3 illustrates a state after the second filter 303 is coupled (e.g., bonded) to the first filter 301 to form the device 300. The at least one interconnect 740 may be coupled to the at least one interconnect 640. The at least one interconnect 340 as described in FIGS. 3 and 4 may represent the at least one interconnect 640 and the at least one interconnect 740. A thermal compression process may be used to the second filter 303 to the first filter 301. Stage 3 may illustrate the device 300 that includes the first filter 301 and the second filter 303.

Figure 8:
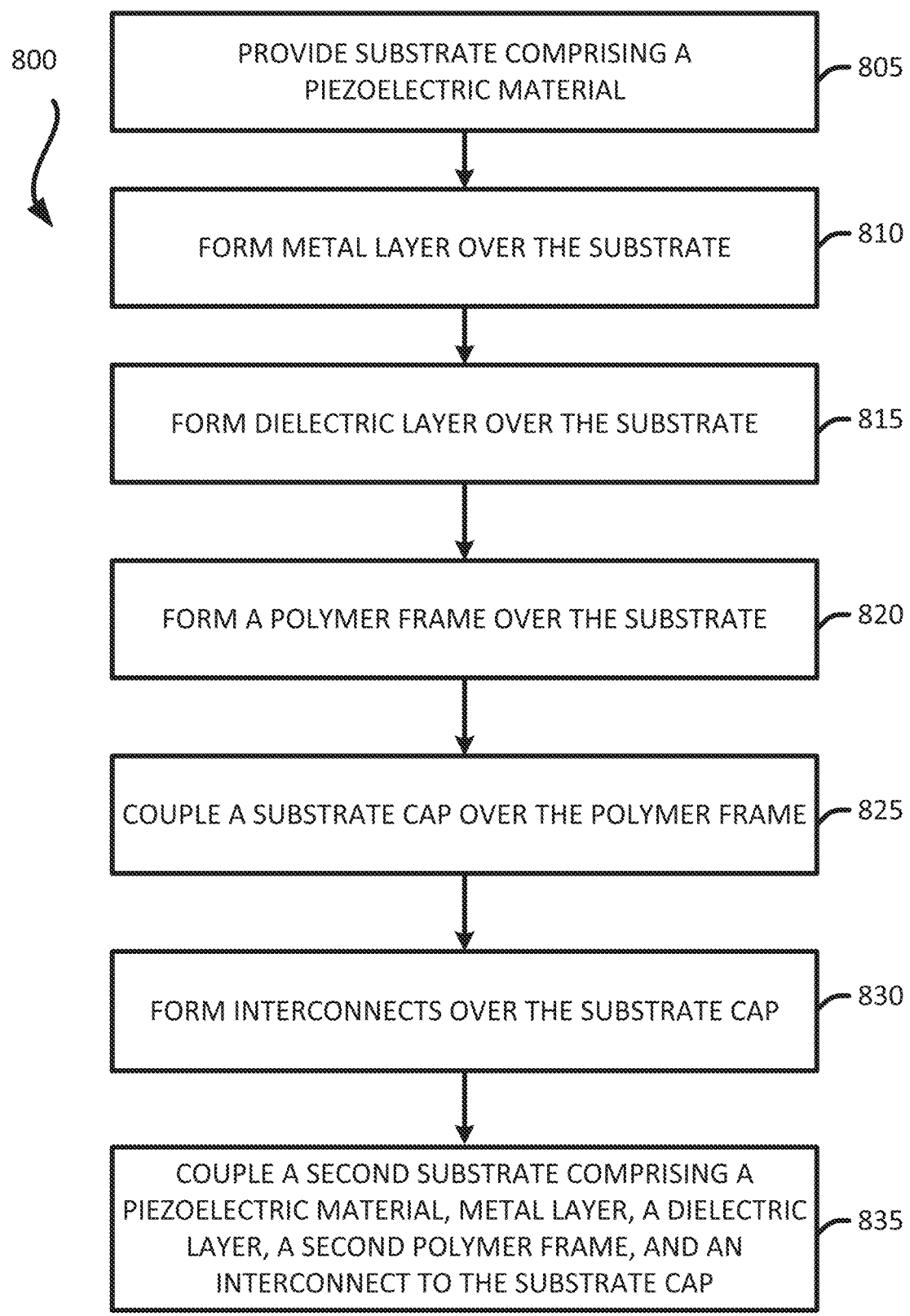
FIG. 8 illustrates an exemplary flow diagram of a method for fabricating a device that includes multiple integrated devices configured to operate as signal filters.

Exemplary Flow Diagram of a Method for Fabricating a Device Comprising Stacked Filters In some implementations, fabricating a device comprising stacked filters includes several processes. FIG. 8 illustrates an exemplary flow diagram of a method 800 for providing or fabricating a device comprising stacked filters. In some implementations, the method 800 of FIG. 8 may be used to provide or fabricate the device 300 of FIG. 3. However, the method 800 may be used to fabricated any device comprising stacked filters.

It should be noted that the sequence of FIG. 8 may combine one or more processes in order to simplify and/or clarify the method for providing or fabricating a device comprising stacked filters. In some implementations, the order of the processes may be changed or modified.

The method provides (at 805) a substrate (e.g., 312) that includes a piezoelectric material. The substrate may be a piezoelectric substrate. In some implementations, the substrate may include a piezoelectric layer that is formed and located over a first surface of the substrate 312. For example, the substrate (e.g., 312) may include glass with a piezoelectric layer formed and located over a first surface of the glass. Stage 1 of FIG. 6A illustrates an example of a substrate that includes a piezoelectric material.

The method forms (at 810) at least one metal layer (e.g., 314) over a first surface of the substrate (e.g., 312). The metal layer may be a patterned metal layer. A plating process may be used to form the metal layer. The metal layer may be formed over a piezoelectric layer of the substrate. The metal layer 314 may be patterned to be configured as transducers, electrodes and/or interconnects. Different implementations may use different patterns and/or configurations for the metal layer 314 over the substrate. The metal layer 314 may represent at least one metal layer. The metal layer 314 may include two or more metal layers. In some implementations, the metal layer 314 may include a first metal layer and a second metal layer. In such instances, forming the at least one metal layer may include forming the first metal layer and then forming the second metal layer, where the second metal layer may be coupled to the first metal layer. The first metal layer and the second metal layer may include the same material or may include different materials. Stage 2 of FIG. 6A illustrates an example of metal layer formation over a substrate.

The method forms (at 815) forms a dielectric layer (e.g., 316) over the first surface of the substrate (e.g., 312). A deposition process may be used to form the dielectric layer 316. The dielectric layer may be formed over a piezoelectric layer of the substrate. Stage 3 of FIG. 6A illustrates an example of forming a dielectric layer over a substrate.

The method forms (at 820) a polymer frame (e.g., 318) over the metal layer (e.g., 314) and the dielectric layer (e.g., 316). The polymer frame may be coupled to the metal layer and the dielectric layer. The polymer frame may be formed over the substrate (e.g., 312). A deposition process may be used to form the polymer frame. The polymer frame may have different shapes and/or sizes. The polymer frame may be configured to provide mechanical and structural support for another component. Stage 4 of FIG. 6B illustrates an example of forming a polymer layer.

The method couples (at 825) a substrate cap (e.g., 320) to the polymer frame (e.g., 318), which may form a void (e.g., 321) between the substrate cap (e.g., 320) and the substrate (e.g., 312). The substrate cap 320 may include the same material as the substrate 312. The substrate cap 320 may be bonded to the polymer frame 318. The polymer frame 318 is configured to provide structural support for the substrate cap 320. The polymer frame 318 may laterally surround the void 321. Stage 5 of FIG. 6B illustrates an example of a substrate cap coupled to the polymer frame.

The method forms (at 830) at least one interconnect (e.g., 640) over surfaces of (i) the substrate 312, (ii) the metal layer 314, (iii) the dielectric layer 316, (iv) the polymer frame 318 and/or (v) the substrate cap 320. A plating process may be used to form the at least one interconnect 640. The at least one interconnect 640 may be part of the at least one interconnect 340, as described in FIGS. 3 and 4. Stage 6 of FIG. 6B may illustrate an example of interconnects formed over surfaces of a filter that includes a substrate, a metal layer, a dielectric layer, a polymer frame, and a substrate cap.

The method couples (at 835) a second filter (e.g., 303) to the substrate cap (e.g., 320). Coupling the second filter to the substrate cap may include coupling the second filter (e.g., 303) to a first filter (e.g., 301). The second filter may include a second substrate (e.g., 332) comprising a piezoelectric material, a second metal layer (e.g., 334), a second dielectric layer (e.g., 336), a second polymer frame (e.g., 338) and at least one interconnect (e.g., 740). Stages 2-3 of FIG. 7 illustrate an example of a second filter coupled to a substrate cap of a first filter.

Exemplary Sequence for Fabricating a Package Comprising Stacked Filters

Figure 9A:
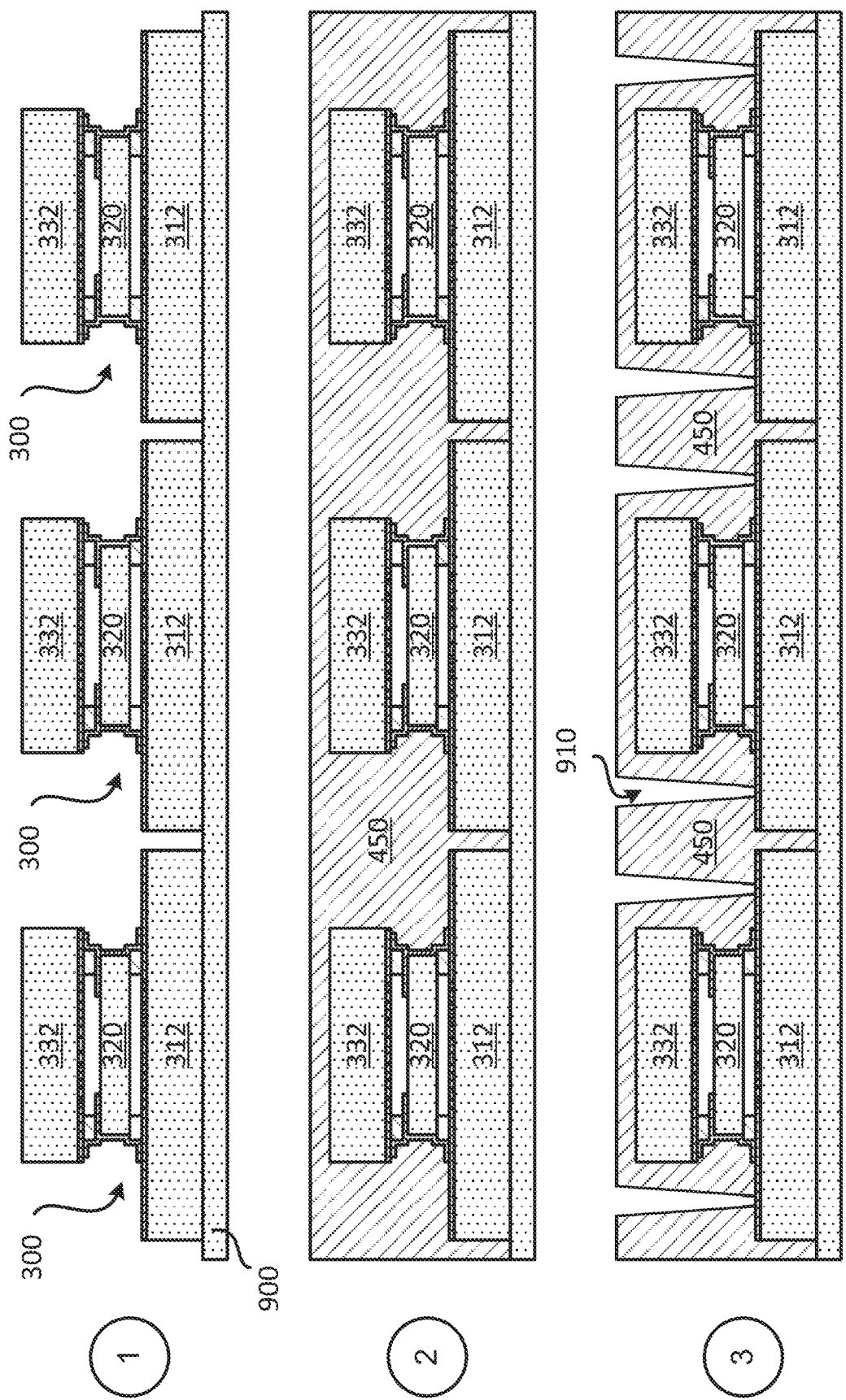
FIGS. 9A-9C illustrate an exemplary sequence for fabricating a package that includes multiple integrated devices configured to operate as signal filters.
Figure 9B:
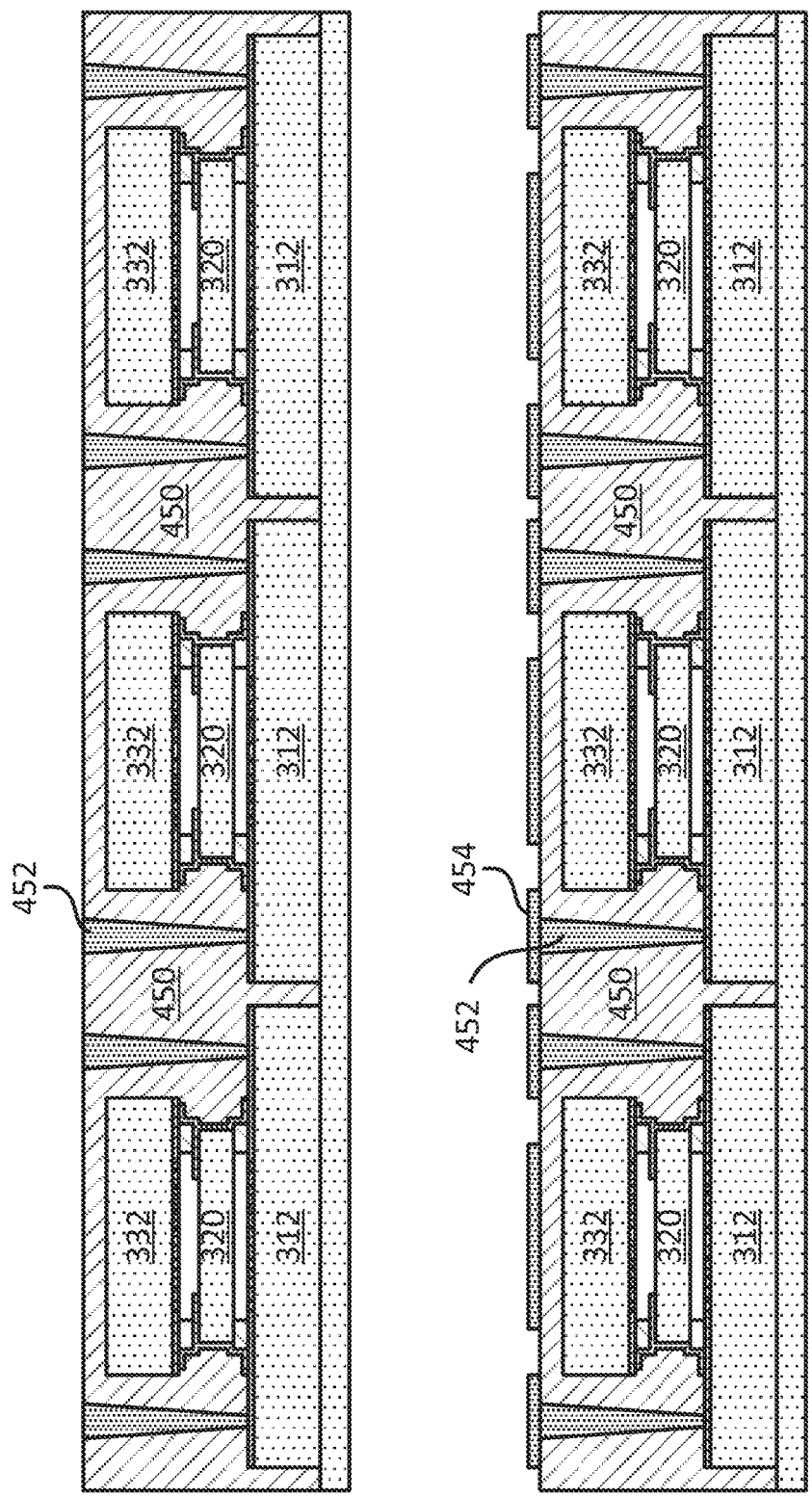
Figure 9C:
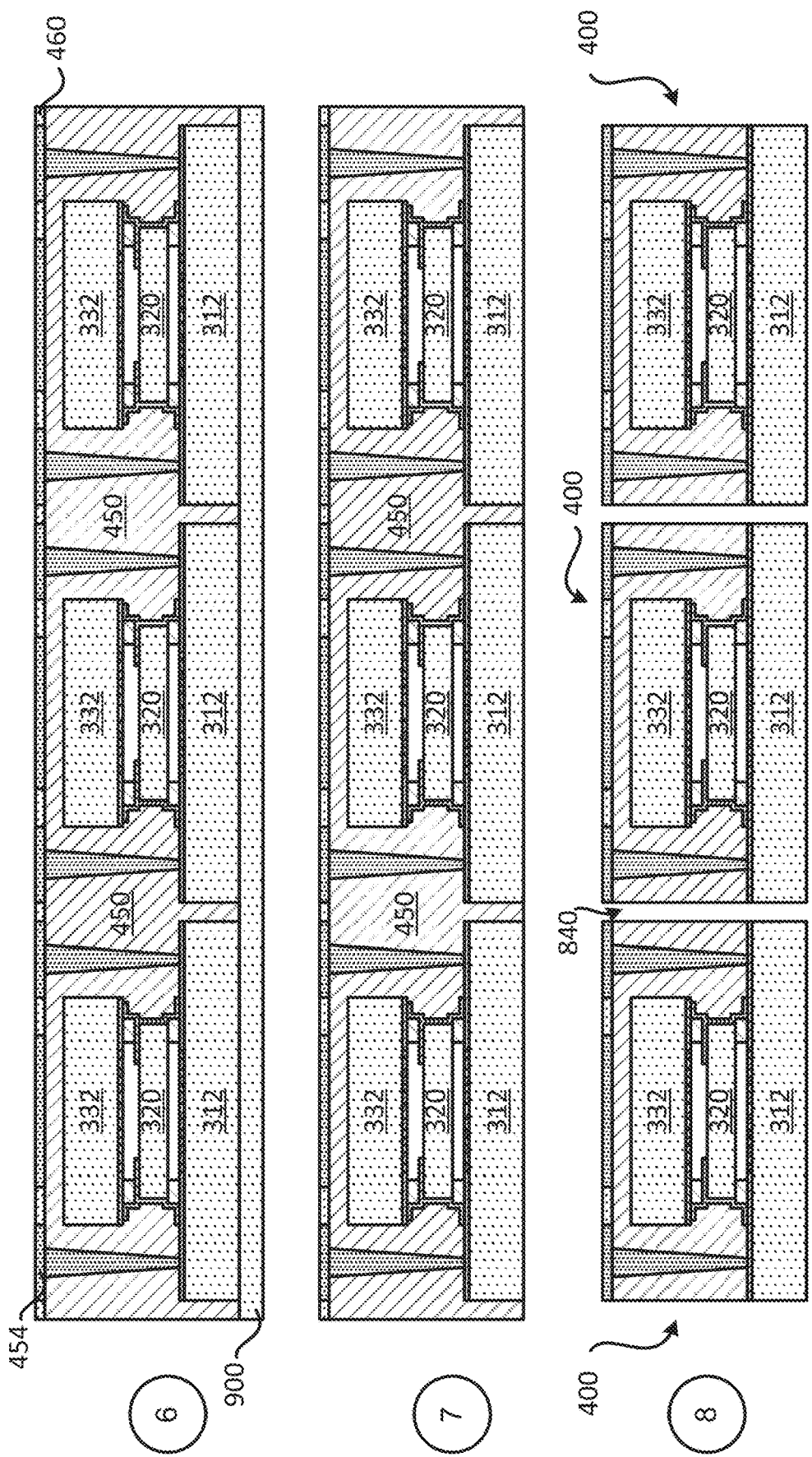

In some implementations, fabricating a package that includes stacked filters for signal filtering includes several processes. FIGS. 9A-9C illustrate an exemplary sequence for providing or fabricating a package that includes stacked filters. In some implementations, the sequence of FIGS. 9A-9C may be used to provide or fabricate the package 400 of FIG. 4 and/or other packages described in the present disclosure.

It should be noted that the sequence of FIGS. 9A-9C may combine one or more stages in order to simplify and/or clarify the sequence for providing or fabricating a package that includes stacked filters. In some implementations, the order of the processes may be changed or modified. In some implementations, one or more of processes may be replaced or substituted without departing from the spirit of the disclosure.

Stage 1, as shown in FIG. 9A, illustrates a state after a plurality of devices 300 is coupled to a carrier 900. Each device 300 may include a first filter 301, a second filter 302 and a substrate cap 320 as described in FIGS. 3 and 4. The carrier 900 may be a substrate (e.g., glass). Different implementations may provide different materials for the carrier 900. An adhesive may be used to couple the plurality of devices 300 to the carrier 900. A pick and place process may be used to place the plurality of devices 300 over the carrier 900.

Stage 2 illustrates a state after an encapsulation layer 450 is formed over the carrier 900 and the plurality of devices 300. The encapsulation layer 450 may include a mold, a resin and/or an epoxy. The encapsulation layer 450 may be means for encapsulation. A compression and transfer molding process, a sheet molding process, or a liquid molding process may be used to form the encapsulation layer 450. The encapsulation layer 450 may encapsulate the first filter 301, the second filter 303 and the substrate cap 320 of each device 300. For example, the encapsulation layer 450 may encapsulate and be formed over surfaces of the first substrate 312, the second substrate 332, the substrate cap 320, the first polymer frame 318, the second polymer frame 338, the interconnect 340, the first metal layer 314, the first dielectric layer 316, the second metal layer 334, and/or the second dielectric layer 336.

Stage 3 illustrates a state after a plurality of cavities 910 is formed in the encapsulation layer 450. A laser process (e.g., laser ablation) and/or etching process may be used to form the plurality of cavities 910. The plurality of cavities 910 may expose portions of the first metal layer 314 of the first filter(s) 301.

Stage 4, as shown in FIG. 9B, illustrates a state after a plurality of through encapsulation vias 452 is formed in the encapsulation layer 450. The plurality of through encapsulation vias 452 may be formed in the plurality of cavities 910. The plurality of through encapsulation vias 452 is coupled to portions of the first metal layer 314. In some implementations, at least one through encapsulation vias 452 may be coupled to at least one interconnect 340. The plurality of through encapsulation vias 452 may be formed through a pasting and sintering process. In some implementations, the plurality of through encapsulation vias 452 may be formed through a plating process.

Stage 5 illustrates a state after a plurality of interconnects 454 is formed over a surface of the encapsulation layer 450. The plurality of interconnects 454 may be coupled to the plurality of through encapsulation vias 452. The plurality of interconnects 454 may be formed through a plating process.

Stage 6, as shown in FIG. 9C, illustrates a state after a passivation layer 460 is formed over and coupled to a surface of the encapsulation layer 450. A deposition process may be used to form the passivation layer 460. The passivation layer 460 may be co-planar with the plurality of interconnects 454.

Stage 7 illustrates a state after the carrier 900 is decoupled from the encapsulation layer 450 and the first substrate 312. The carrier 900 may be peeled off or grinded off.

Stage 8 illustrate a state after singulation of the encapsulation layer 450 to form a plurality of packages 400. After singulation, each package 400 may include stacked filters, as described in FIG. 4. Solder interconnects (e.g., 470) may be coupled to the plurality of interconnects 454 before or after singulation.

Figure 10:
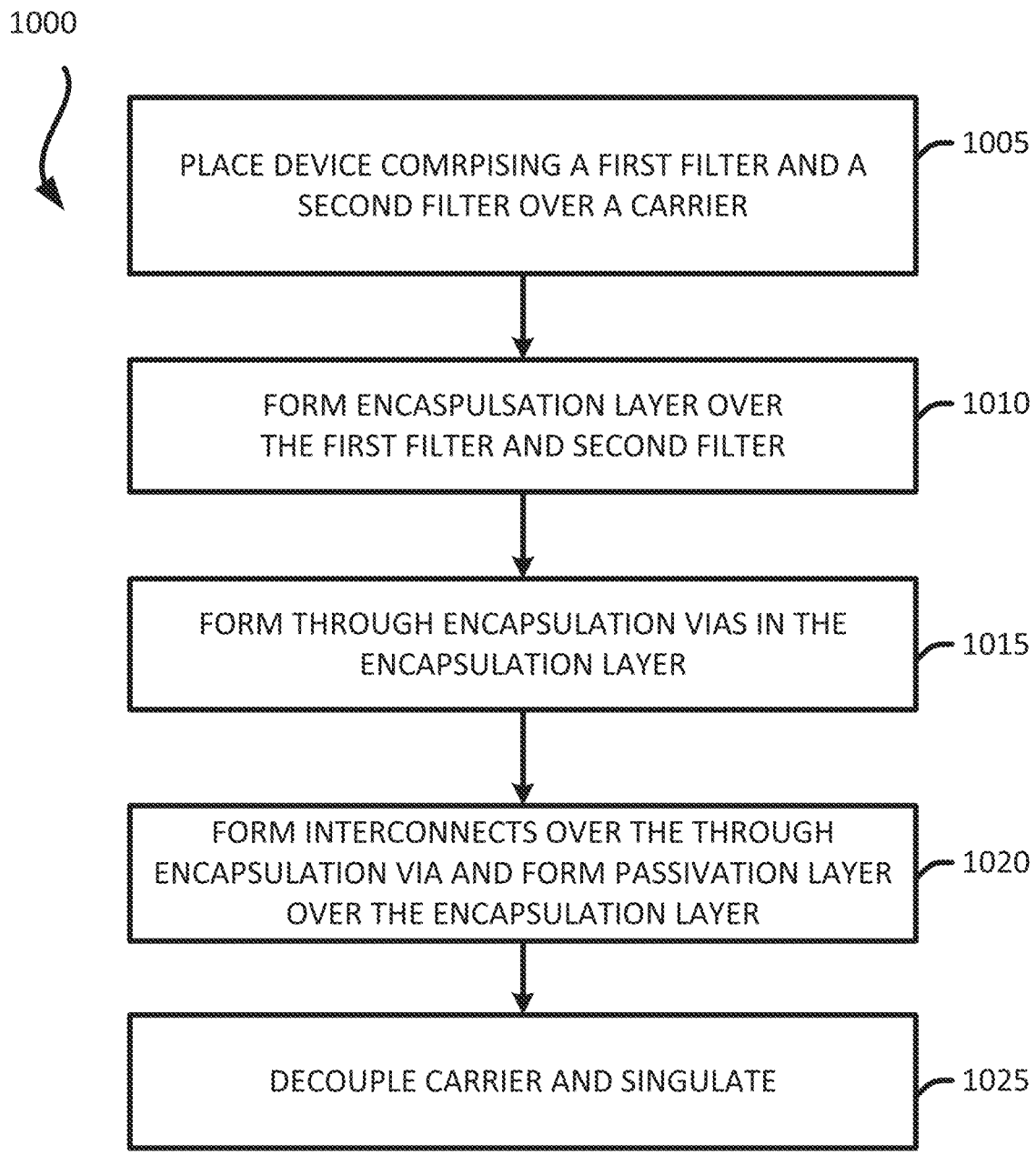
FIG. 10 illustrates an exemplary flow diagram of a method for fabricating a package that includes multiple integrated devices configured to operate as signal filters.

Exemplary Flow Diagram of a Method for Fabricating a Package Comprising Stacked Filters In some implementations, providing a package that includes stacked filters for signal filtering includes several processes. FIG. 10 illustrates an exemplary flow diagram of a method 1000 for providing or fabricating a package that includes stacked filters. In some implementations, the method 1000 of FIG. 10 may be used to provide or fabricate the package of FIG. 4 and/or other packages described in the present disclosure.

It should be noted that the method of FIG. 10 may combine one or more processes in order to simplify and/or clarify the method for providing or fabricating a package that includes stacked filters for signal filtering. In some implementations, the order of the processes may be changed or modified.

The method places (at 1005) a device (e.g., 300) comprising a first filter (e.g., 301) and a second filter (e.g., 303) over a carrier (e.g., 900). In some implementations, a plurality of devices 300 may be placed and coupled to the carrier. Each device 300 may include the first filter 301, the second filter 302 and the substrate cap 320 as described in FIGS. 3 and 4. The carrier 900 may be a substrate (e.g., silicon, quartz, glass). Different implementations may provide different materials for the carrier 900. An adhesive may be used to couple the plurality of devices 300 to the carrier 900. A pick and place process may be used to place the plurality of devices 300 over the carrier 900. Stage 1 of FIG. 9A illustrates an example of placing a device over a carrier.

The method forms (at 1010) an encapsulation layer (e.g., 450) over the carrier (e.g., 900) and the plurality of devices (e.g., 300). The encapsulation layer 450 may include a mold, a resin and/or an epoxy. The encapsulation layer 450 may be means for encapsulation. A compression and transfer molding process, a sheet molding process, or a liquid molding process may be used to form the encapsulation layer 450. The encapsulation layer 450 may encapsulate the first filter 301, the second filter 303 and the substrate cap 320 of each device 300. For example, the encapsulation layer 450 may encapsulate and be formed over surfaces of the first substrate 312, the second substrate 332, the substrate cap 320, the first polymer frame 318, the second polymer frame 338, the interconnect 340, the first metal layer 314, the first dielectric layer 316, the second metal layer 334, and/or the second dielectric layer 336. Stage 2 of FIG. 9A illustrates an example of forming an encapsulation layer.

The method forms (at 1015) a plurality of through encapsulation vias (e.g., 452) in the encapsulation layer (e.g., 450). Forming the plurality of encapsulation vias may include forming a plurality of cavities (e.g., 910) in the encapsulation layer. A laser process (e.g., laser ablation) and/or etching process may be used to form the plurality of cavities (e.g., 910). The plurality of through encapsulation vias 452 may be formed in the plurality of cavities (e.g., 910). The plurality of through encapsulation vias 452 may be coupled to portions of the first metal layer 314. In some implementations, at least one through encapsulation vias 452 may be coupled to at least one interconnect 340. The plurality of through encapsulation vias 452 may be formed through a pasting and sintering process. In some implementations, the plurality of through encapsulation vias 452 may be formed through a plating process. Stages 3-4 of FIGS. 9A-9B illustrate an example of forming through encapsulation vias.

The method forms (at 1020) a plurality of interconnects (e.g., 454) over a surface of the encapsulation layer 450. The plurality of interconnects 454 may be coupled to the plurality of through encapsulation vias 452. The plurality of interconnects 454 may be formed through a plating process. The method forms (at 1020) a passivation layer (e.g., 460) over the encapsulation layer 450. A deposition process may be used to form the passivation layer 460. The passivation layer 460 may be co-planar with the plurality of interconnects 454. Stages 5-6 of FIGS. 9B-9C illustrate an example of forming interconnects and a passivation layer.

The method decouples (at 1025) the carrier (e.g., 900) from the encapsulation layer 450 and the first substrate 312. The carrier 900 may be peeled off or grinded off. The method singulates (at 1030) the encapsulation layer (e.g., 450) to form a plurality of packages 400. After singulation, each package 400 may include stacked filters, as described in FIG. 4. A plurality of solder interconnects (e.g., 470) may be coupled to the plurality of interconnects 454 before or after singulation. Stages 7-8 of FIG. 9C illustrate an example of a decoupling of the carrier and singulation to form multiple packages with stacked filters.

Exemplary Electronic Devices

Figure 11:
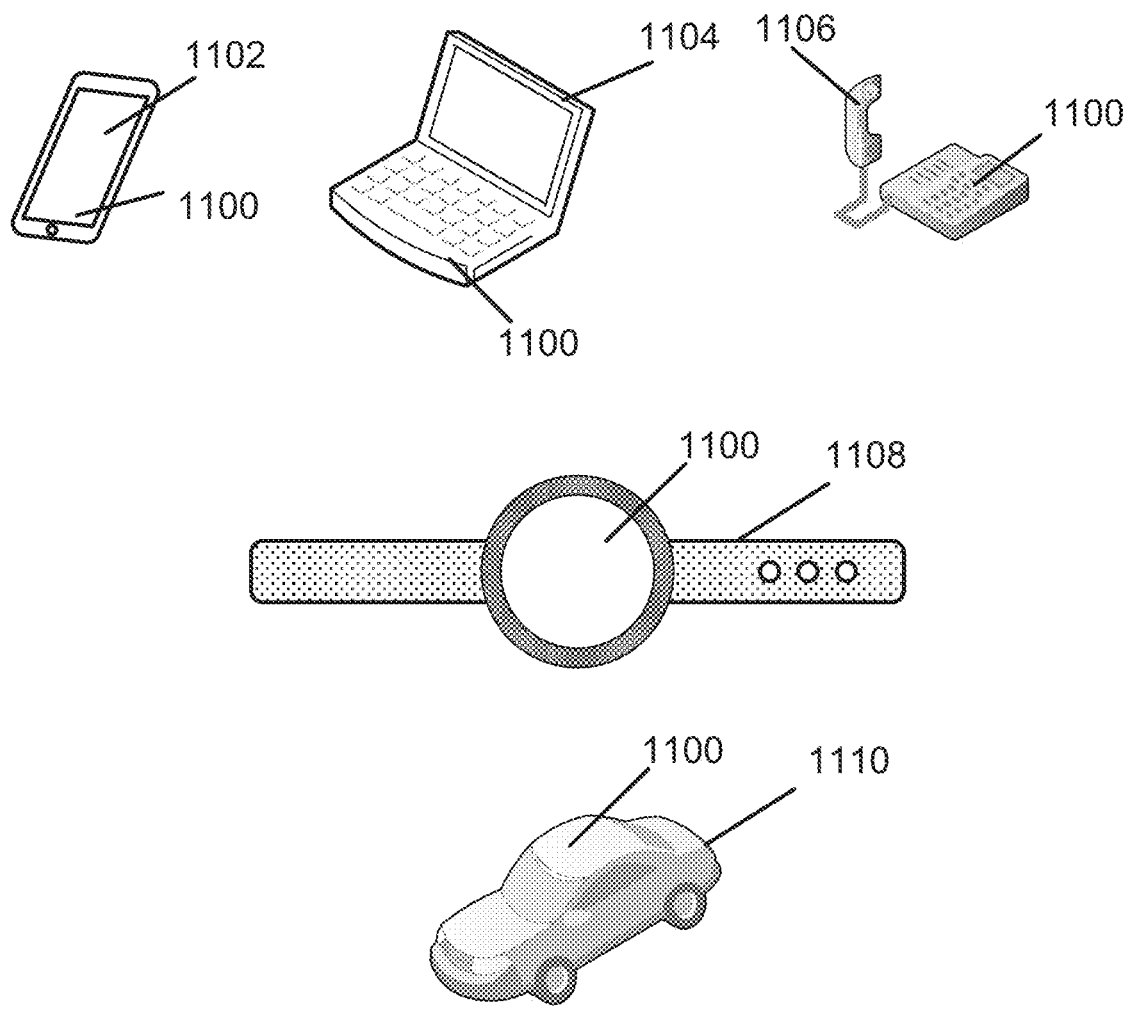
FIG. 11 illustrates various electronic devices that may integrate a die, an integrated device, an integrated passive device (IPD), a passive component, a package, and/or a device package described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-5, 6A-6C, 7, 8, 9A-9B, and/or 10-11 may be rearranged and/or combined into a single component, process, feature or function or embodied in several components, processes, or functions. Additional elements, components, processes, and/or functions may also be added without departing from the disclosure. It should also be noted FIGS. 1-5, 6A-6C, 7, 8, 9A-9B, and/or 10-11 and its corresponding description in the present disclosure is not limited to dies and/or ICs. In some implementations, FIGS. 1-5, 6A-6C, 7, 8, 9A-9B, and/or 10-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a first filter comprising a first polymer frame, wherein the first filter comprises a first integrated device that includes:
a first substrate comprising a first piezoelectric material; and
a first metal layer coupled to a first surface of the first substrate;
a substrate cap coupled to the first polymer frame such that a first void is formed between the substrate cap and the first filter, wherein the first void is defined by at least the first filter, the first polymer frame and the substrate cap;
a second filter comprising a second polymer frame,
wherein the second polymer frame is coupled to the substrate cap such that a second void is formed between the substrate cap and the second filter,
wherein the second void is defined by at least the second filter, the second polymer frame and the substrate cap, and wherein the second filter comprises a second integrated device that includes:
- a second substrate comprising a second piezoelectric material; and
- a second metal layer coupled to a first surface of the second substrate;

at least one interconnect coupled to the first filter and the second filter, wherein the at least one interconnect is coupled to a surface of the first polymer frame, a surface of the substrate cap and a surface of the second polymer frame;

an encapsulation layer encapsulating the first filter, the substrate cap, the second filter, and the at least one interconnect; and a plurality of through encapsulation vias coupled to the first filter, wherein at least one through encapsulation via is coupled to and directly touching the first metal layer of the first filter.

2. The package of claim 1, wherein the substrate cap is located between the first filter and the second filter.

3. The package of claim 2, wherein the second piezoelectric material includes the same material as the first piezoelectric material.

4. The package of claim 2, wherein the first substrate comprising the first piezoelectric material includes a substrate and a piezoelectric layer formed over the substrate.

5. The package of claim 2, wherein the second substrate comprising the second piezoelectric material includes a substrate and a piezoelectric layer formed over the substrate.

6. The package of claim 2, wherein the first integrated device includes a first die configured to operate as the first filter, and the second integrated device includes a second die configured to operate as the second filter.

7. The package of claim 1,
wherein the surface of the first polymer frame comprises a side surface of the first polymer frame, and
wherein the surface of the second polymer frame comprises a side surface of the second polymer frame.

8. The package of claim 1, wherein the first filter is configured to operate as a surface acoustic wave (SAW) filter or a bulk acoustic wave (BAW) filter.

9. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

10. An apparatus comprising:
means for first filtering comprising a first polymer frame, wherein the means for first filtering comprises a first integrated device that includes:
- a first substrate comprising a first piezoelectric material; and
- a first metal layer coupled to a first surface of the first substrate;

a substrate cap coupled to the first polymer frame such that a first void is formed between the substrate cap and the means for first filtering;

means for second filtering comprising a second polymer frame, wherein the second polymer frame is coupled to the substrate cap such that a second void is formed between the substrate cap and the means for second filtering;

at least one interconnect coupled to the means for first filtering and the means for second filtering, wherein the at least one interconnect is formed over a surface of the first polymer frame, a surface of the substrate cap and a surface of the second polymer frame;

means for encapsulation encapsulating the means for first filtering, the substrate cap, the means for second filtering, and the at least one interconnect; and a plurality of through encapsulation vias coupled to the means for first filtering, wherein at least one through encapsulation via is coupled to and directly touching the first metal layer of the means for first filtering.

11. The apparatus of claim 10,
wherein the first void is defined by at least the first filter, the first polymer frame and the substrate cap,
wherein the second void is defined by at least the second filter, the second polymer frame and the substrate cap, and
wherein the means for second filtering comprises a second integrated device that includes:
- a second substrate comprising a second piezoelectric material; and
- a second metal layer coupled to a first surface of the second substrate.

12. The apparatus of claim 11, wherein the second piezoelectric material includes the same material as the first piezoelectric material.

13. The apparatus of claim 11, wherein the first substrate comprising the first piezoelectric material includes a substrate and a piezoelectric layer formed over the substrate.

14. The apparatus of claim 11, wherein the first integrated device includes a first die configured to operate as a first signal filter, and the second integrated device includes a second die configured to operate as a second signal filter.

15. The apparatus of claim 10,
wherein the surface of the first polymer frame comprises a side surface of the first polymer frame, and
wherein the surface of the second polymer frame comprises a side surface of the second polymer frame.

16. The apparatus of claim 10, wherein the means for second filtering is configured to operate as a surface acoustic wave (SAW) filter or a bulk acoustic wave (BAW) filter.

17. The apparatus of claim 10, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *